United States Patent [19]

Fazekas

[11] Patent Number: 4,477,775
[45] Date of Patent: Oct. 16, 1984

[54] METHOD AND APPARATUS FOR A FAST INTERNAL LOGIC CHECK OF INTEGRATED CIRCUITS

[75] Inventor: Peter Fazekas, Munich, Fed. Rep. of Germany

[73] Assignee: Siemens Aktiengesellschaft, Berlin & Munich, Fed. Rep. of Germany

[21] Appl. No.: 333,764

[22] Filed: Dec. 23, 1981

[30] Foreign Application Priority Data

Mar. 16, 1981 [DE] Fed. Rep. of Germany ....... 3110140

[51] Int. Cl.$^3$ .................... G01R 31/26; G01N 23/00
[52] U.S. Cl. ............................. 324/158 R; 250/310; 324/158 D; 371/15
[58] Field of Search .................. 324/158 D, 158 R; 250/310; 371/15, 21, 25

[56] References Cited

U.S. PATENT DOCUMENTS

| 4,220,853 | 9/1980 | Feuerbaum et al. | 324/158 D |
|---|---|---|---|
| 4,220,854 | 9/1980 | Feuerbaum | 324/158 D |
| 4,223,220 | 9/1980 | Feuerbaum | 324/158 D |
| 4,277,679 | 7/1981 | Feuerbaum | 324/158 D |

OTHER PUBLICATIONS

"Electron-Beam Testing of VLSI Circuits", E. Wolfgang et al., IEEE J. Solid-State Circ., vol. SC-14, No. 2, Apr., 1979, pp. 471-481.
"Der Elektronenstrahl als belastungsfreie Mess-sonde zur Untersuchung hochintegrierter MOS-Schaltungen", P. Fazekas et al., NTG-FACHBERICHTE, vol. 68, VDE-VERLAG GmbH, Berling, pp. 149-152, 1979.
"Application of Electron Beam Measurement Techniques for Varifying Computer Simulations at Large Scale IC", Feuerbaum et al., SEM/1978, pp. 795-800.
"Electron Beam Testing of Microprocessors", G. Crichton et al., Digest of Papers 1980 IEEE Test Conference, pp. 444-449.
"Logic Analyzers-Sharp Fault Finders Getting Sharper" J. McLeod, Electronic Design, 28, 1980, 7, pp. 48-56.
"Beitrage zu Fortschritten in der Elektronenstrahlmesstechnik", Beitrage Elektronenmikroskopischer Direktabbildung Oberfl. 11, 67-71, 1978.
"Use of SEM for Multichannel Sampling Oscillography", Feuerbaum and Wolfgang, Proceedings of the IEEE, vol. 66, No. 8, pp. 984-985, 1978.
"Quantitative Voltage Contrast at High Frequencies in the SEM", L. Balk et al., SEM/1976, pp. 615-624.
"Estimate of Minimum Measureable Voltage in the SEM", A. Gopinath, J. Phys. E: Sci. Instrum., vol. 10, pp. 911-913, 1977.
"Internal Testing of Microprocessor Ships Using Electron Beam Techniques", E. Wolfgang et al., Proceedings of the IEEE International Conference of Circuits and Computers 1980, pp. 548-551, 1980.
"VLSI-Testing Using the Electron Probe", Feuerbaum, SEM/1979, pp. 285-296, 1979.

Primary Examiner—Ernest F. Karlsen
Attorney, Agent, or Firm—Hill, Van Santen, Steadman & Simpson

[57] ABSTRACT

A method and apparatus for conducting a fast internal logic check of integrated circuits whereby the operations on all data lines of a data bus can be simultaneously represented employ a pulsed electron beam as a measuring probe, a scan generator for changing the position of the measuring probe, an evaluator for the potential-contrast signal, a computer or logic analyzer for evaluating the measured values, and a sequence control device for controlling the sequence of operation of the method and device. Given a fixed phase relation of the program cycle of the integrated circuit to be checked, the pulsed electron beam is successively directed to different test locations and the potential-contrast signal for each test location is registered and logically evaluated. The test results gained at the various phase relations are relayed to the logic analyzer and evaluated therein.

11 Claims, 2 Drawing Figures

METHOD AND APPARATUS FOR A FAST INTERNAL LOGIC CHECK OF INTEGRATED CIRCUITS

BACKGROUND OF THE INVENTION

The present invention relates to methods and apparatus for conducting an internal logic check of integrated circuits, and in particular to such devices and methods for conducting such a check of integrated circuits with high data processing capacity.

Description of the Prior Art

Given the rapidly increasing development of microprocessors and microcomputers with higher data processing capabilities, conventional testing means for such devices, which employ chronological and voltage resolution at critical circuit nodes in search of circuit errors or design weaknesses, are no longer practical or reliable in view of the increasingly complex nature of the integrated logic circuits to be tested. Moreover, in order to check the behavior of a particular circuit portion with a suitable degree of certainty, a number of internal control and data lines must frequently be additionally tested. The measurement of the signals on those lines serves as a survey relating to the logical cooperation of individual circuit parts, and tests whether all necessary input signals are supplied to the particular area under investigation. Such inspections are generally limited to a reproduction of the logical states.

Many methods and devices are known for checking the internal nodes in large scale integrated circuits with a mechanical test probe. For the testing of internal buses, however, the number of such mechanical test probes must equal the number of lines in the bus, which requires a large number of such mechanical test probes to be put in place on the circuit in an extremely constricted area. Conventional circuits exhibit approximately 2 micrometers spacing between adjacent bus lines.

One solution to the inherent space problems associated with mechanical test probes has been the use of an electron probe for inspecting the internal nodes in large scale integrated circuits as is described, for example, in the articles "Electron-Beam Testing of VLSI Circuits", E. Wolfgang et al, IEEE J. Solid-State Circ. Vol. SC-14, No. 2, April, 1979, pages 471-481 and "Der Elektronenstrahl als belastungsfreie Mess-sonde zur Untersuchung hochintegrierter MOS-Schaltungen", P. Fazekas et al, NTG-FACHBERICHTE, Vol. 68, VDE-VERLAG GmbH, Berling, pages 149-152, 1979. The techniques described in those articles, however, cannot simultaneously represent the operations on all data lines as is required for checking microprocessors and microcomputers with data capacities up to 16 bits and more.

The initial investigation of the use of an electron probe for checking microprocessors were undertaken in 1978 by Feuerbaum and Hernaut on the microcross counter of a four-bit microprocessor, the results of those investigations being published in the article "Application of Electron Beam Measurement Techniques for Varifying Computer Simulations at Large Scale IC", Feuerbaum et al, SEM/1978, pages 795-800. Subsequent investigations showed that a series of further functions in microprocessors can be checked with various other electron beam test methods, as described in the article "Electron Beam Testing of Microprocessors", G. Crichton et al, Digest of Papers 1980 IEEE Test Conference, pages 444-449, 1980.

SUMMARY OF THE INVENTION

It is an object of the present invention to provide a method and apparatus for undertaking a fast internal logic check of integrated circuits wherein the operations on all data lines of a bus can be simultaneously represented.

The above object is inventively achieved in a method and apparatus which employ a pulsed electron beam which is successively directed at different test locations in an integrated circuit which has a fixed phase relation of the program cycle. The potential-contrast signal from each test location is registered and logically evaluated and the test results obtained at the various phase relations are relayed to a computer or logic analyzer which evaluates the test results.

The electron beam can be simply and quickly positioned. In order to realize operation of the device, the pulsed electron beam is successively directed at different test locations, given a fixed phase relation of the program sequence of the integrated circuit as stated above. In this manner, the measured results from various phase relations of the program cycle of the integrated circuit can be relayed to the computer or logic analyzer until the desired phase area such as, for example, the program section, is recorded.

Inscription of the measured results into the logic analyzer or computer offers the advantage that the results can be displayed in a surveyable manner in time diagrams and that the measured results can be listed in a hexadecimal representation. In addition, all of the usual evaluation aids associated with such a computer or logic analyzer are available for operation on the measured results.

As stated above, the measured results can be represented in a time diagram, which is designated as a logic diagram. With the electron probe, the chronological sequence of the logical states on a plurality of data lines can be simultaneously represented in such a logic diagram. In order to generate the logic diagram, the electron beam skips from test location to test location in a manner known from electron lithography known as a vector probe technique.

The information content of the logic diagrams corresponds to that of a conventional logic analyzer as is employed for checking microcomputers and calculators of the type described, for example, in "Logic Analyzers-Sharp Fault Finders Getting Sharper" J. McLeod, Electronic Design, 28, 1980, 7, pages 48-56. The recording of the logic diagram corresponding to a logic analyzer significantly improves the ability to survey the test results.

DESCRIPTION OF THE PREFERRED EMBODIMENTS

The technique described below is an improvement over earlier investigations of this subject matter by Feuerbaum, the results of which are described in the articles "Beiträge zu Fortschritten in der Elektronenstrahlmesstechnik", Beiträge Elektronenmikroskopischer Direktabbildung Oberfl. 11, 67–71, 1978 and "Use of SEM for Multichannel Sampling Oscillography", Feuerbaum and Wolfgang, Proceedings of the IEEE, Vol. 66, No. 8, pages 984–985, 1978. The experimental investigations were undertaken on an unpassivated 8085 microprocessor which was developed and manufactured in a specially-contracted version at Siemens AG, assignee of the subject matter of the present application.

The technique for producing a logic diagram employed in the method disclosed herein is based on the known sampling principle described, for example, in the article "Quantitative Voltage Contrast at High Frequencies in the SEM", L. Balk et al, SEM/1976, pages 615–624. In electron beam measuring technology, the electron probe is pulsed at the frequency of the program loop and the phase is shifted over the entire loop or portions thereof. The program loops should accordingly be as short as possible, because the pulse-to-pulse ratio cannot be permitted to become too small so as to prevent sampling techniques with the electron probe. This aspect of electron beam measuring technology is discussed in the article "Estimate of Minimum Measureable Voltage in the SEM", A. Gopinath, J. Phys. E: Sci. Instrum., Vol. 10, pages 911–913, 1977.

Figure 1:
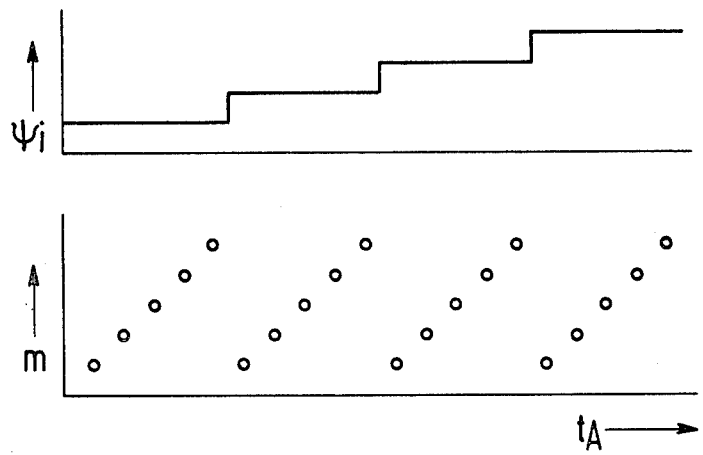
FIG. 1 is a graphical representation of the chronological sequence of a logic check method at five test locations in accordance with the principles of the method disclosed herein.

The chronological cycle for generating a logic diagram in accordance with the method disclosed and claimed herein is shown in FIG. 1 given five test locations. The time range to be recorded is divided into phase points $\psi_i$ over an exposure time $t_4$. The pulsed electron probe first skips at a constant phase, meaning that the cut-in time of the electron probe relative to the trigger signal of the control of the circuit which is being investigated is maintained at a constant successively from one test point m to another test point m until test results are obtained from all five test locations at the constant initial phase. The dwell time of the pulsed electron probe at the test locations is selected such that the logical conditions "0" and "1" can be distinguished with certainty. After the initial constant phase is completed, that is after the electron probe has arrived at the last test location, the probe skips back to the first test location, at which time the phase is changed by an adjustable discrete value. The pulsed electron probe then skips from the first through the last test location at this new altered phase until the entire program loop or specific selected portions thereof have been imaged.

Figure 2:
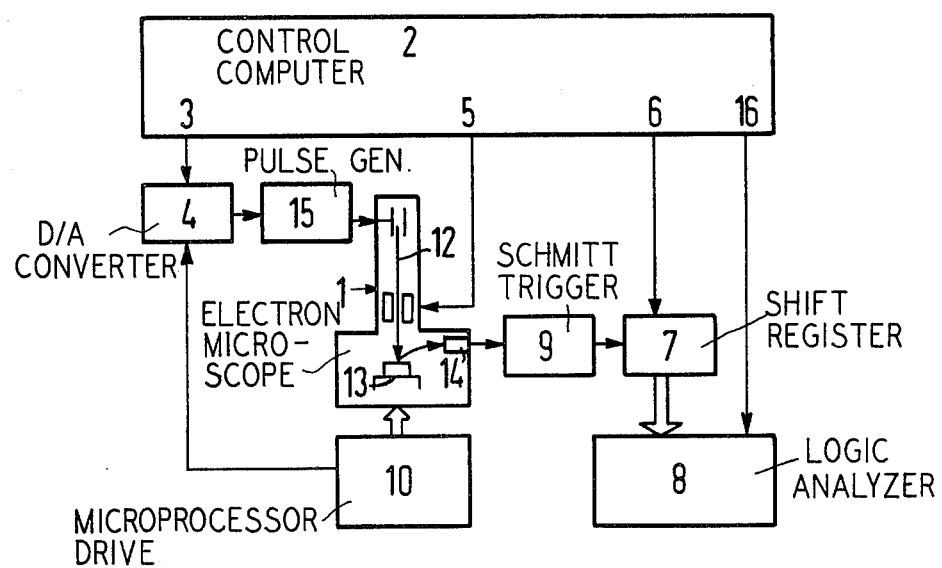
FIG. 2 is a block diagram of a test installation for recording logic diagrams constructed in accordance with the principles of the present invention.

A block diagram of a test installation for conducting the method described in connection with FIG. 1 is shown in FIG. 2 for production of a logic diagram. The test installation employs a modified scanning electron microscope 1 which may be an Etec-autoscan of the type described in the article "Internal Testing of Microprocessor Chips Using Electron Beam Techniques", E. Wolfgang et al, Proceedings of the IEEE International Conference of Circuits and Computers 1980, pages 548–551, 1980. The sequence of the measurement in the manner described in connection with FIG. 1 is controlled by a control computer 2, which may be an Interdata 6/16 model. Phase control of the pulse generator 15 is achieved through a digital to analog converter 4 which receives one input from a phase control output 3 of the control computer 2 and which also exhibits a time delay. The device on which the internal logic check is being undertaken is referenced at 13, and in the exemplary embodiment wherein this device is a microprocessor, the device 13 is suitably driven by a microprocessor drive means 10, which also controls operation of the digital to analog converter 4.

Positioning of the probe at the individual test locations is undertaken by means of a digital screen generator output 5 of the control computer 2, which is connected to the electron microscope 1. The electron microscope 1 has a pulsed electron beam 12 which is directed at the device 13 to be checked. The electron beam, as explained in the literature mentioned herein, causes the emission of secondary electrons at the test locations which represent test values. The electron microscope 1 further has an electron beam collector 14 which supplies an output signal to a Schmitt trigger 9, which in turn supplies a logic "0" or "1" to a shift register 7. The acceptance of the logic signals into the shift register 7 from the Schmitt trigger 9 is controlled by a shift clock output 6 of the control computer 2.

When all measured values of a particular phase relation have been stored in the shift register 7, the values are transferred to a logic analyzer 8 which is enabled to simultaneously receive all of the measured values by a transfer pulse occurring at a transfer pulse output 16 of the control computer 2. The logic analyzer 8 may be, for example, a Biomation K 100 model and the microprocessor drive means 10 may be an HP $\mu$-Lab 5036 A model. Evaluation of the quantitative voltage signal received from the electron microscope 1 by means of the Schmitt trigger circuit 9 can be conducted in the manner described in the article "VLSI-Testing Using the Electron Probe", Feuerbaum, SEM/1979, pages 285–296, 1979.

In measurements taken on the internal data bus of the above-described 8085 microprocessor (the device 13) on a test apparatus of the type shown in FIG. 2 utilizing the method described in connection with FIG. 1, the input program loops were exactly reproduced. The use of the inventive method and apparatus permits logic diagrams to be obtained within integrated circuits by the use of the electron probe so that weaknesses and faults in microprocessors and microcomputers which could not heretofore be detected by other means can be successfully eliminated.

The number of test locations corresponds to the capabilities of the logic analyzer 8 which is employed. In the above-described tests undertaken with the apparatus of FIG. 2, sixteen test locations could be checked. The chronological resolution of the installation depends upon the width of the electron pulses. In the device shown in FIG. 2, pulses having a duration of one ns were routinely attained, so that a one GHz logic analyzer can be used for cyclical program sequences. In comparison to quantitative measurement, the described method possesses the advantage that not only can one work without a spectrometer and control system, because a threshold value circuit directly evaluates the video signal and supplies the logical condition as a measured value, but also a significantly higher recording speed can be achieved. A logic diagram can be recorded in less than one-thousands of the time which is required for a conventional logic image, because only the relevant measured values are detected by the vector probe technique employed herein. The measured results obtained after each "line scanning" which is executed given a fixed phase relation need not necessarily be stored in the intermediate memory (the shift register 7) and subsequently relayed in parallel to the logic analyzer 8. A random number of test results, which are to be respectively transferred in parallel from the shift register 7 to the logic analyzer 8, can remain in the shift register 7 before the test results are relayed to the logic analyzer. Thus, any number of test results for the various phase relations of a program loop can be first inscribed in the shift register 7 before being relayed to the logic analyzer.

Additionally, the logic analyzer 8 may be replaced by any suitable device which can store and evaluate logic test results. The test results may, for example, be directly inscribed from the output of the Schmitt trigger circuit 9 into the control computer 2 and be evaluated therein. Once evaluated, the test results can of course be inscribed in a different computer and evaluated therein, or evaluated in further computers.

In order to accelerate the evaluation of a logic diagram which is to be recorded, test results only from such phases as which meet a selected condition need be inscribed into the computer 2 or the logic analyzer 8 in accordance with the method disclosed herein. Test results from such phase relations at which no logical condition changes occur can, for example, be omitted.

Although modifications and changes may be suggested by those skilled in the art it is the intention of the inventor to embody within the patent warranted hereon all changes and modifications as reasonably and properly come within the scope of his contribution to the art.

I claim as my invention:

1. An apparatus for conducting a fast internal logic check of an integrated circuit with a fixed phase position sequence cycle, said apparatus comprising:
    a means for directing a pulsed electron beam at an integrated circuit to be checked as a test probe;
    a scan generator for selectively changing the position of said test probe from test location to test location for testing selected phases of said integrated circuit by generating a potential contrast signal at the test locations representing test values;
    a means for receiving said potential contrast signal and generating a plurality of corresponding test values;
    a logic analyzer for evaluating said test values; and
    a means for sequentially controlling the positioning of said electron beam and evaluation of said test values.

2. The apparatus of claim 1 wherein said means for receiving said potential contrast signal from said integrated circuit and for generating said test values includes a Schmitt trigger circuit.

3. The apparatus of claim 1 further comprising an intermediate memory connected between said means for receiving said potential contrast signal from said integrated circuit and said logic analyzer for intermediately storing said test values and for selectively transferring said test values to said logic analyzer, said intermediate memory being connected to said sequence control means for controlling said transfer to said logic analyzer.

4. The apparatus of claim 3 wherein said intermediate memory is a shift register.

5. A method for conducting a fast internal logic check of an integrated circuit, said integrated circuit having a program cycle with a fixed phase relation, said method comprising the steps of:
    successively directing a pulsed electron beam at different test locations on said integrated circuit in accordance with said fixed phase relation of said program cycle for generating a potential contrast signal representing test values;
    receiving said potential contrast signal and generating a corresponding test value for each test location on said integrated circuit;
    respectively registering said test values for each of said locations; and
    relaying said test values to a logic analyzer for evaluating said test values and generating test results.

6. The method of claim 5 wherein said test results are represented as time diagrams.

7. The method of claim 5 wherein said test results are represented in hexadecimal form.

8. The method of claim 5 wherein only a portion of said test values for such phases of said program cycle of said integrated circuit as satisfy a pre-determined condition are selected for evaluation and generation of test results associated therewith.

9. The method of claim 5 comprising the additional step of intermediately storing said test values before relaying said test values to said logic analyzer.

10. The apparatus of claim 1 wherein said potential contrast signal consists of secondary electron emission.

11. The method of claim 5 wherein the step of successively directing a pulsed electron beam at different test locations on said integrated circuit in accordance with said fixed phase relation of said program cycle for generating a potential contrast signal representing test values is further defined by the step of successively directing a pulsed electron beam at different test locations on said integrated circuit in accordance with said fixed phase relation of said program cycle for generating a potential contrast signal consisting of secondary electron emission representing test values.

* * * * *